United States Patent
Ho et al.

(10) Patent No.: US 10,068,836 B2
(45) Date of Patent: Sep. 4, 2018

(54) METAL GATE TRANSISTOR, INTEGRATED CIRCUITS, SYSTEMS, AND FABRICATION METHODS THEREOF

(71) Applicant: TAIWAN SEMICONDUCTOR MANUFACTURING COMPANY, LTD., Hsinchu (TW)

(72) Inventors: Chien-Chih Ho, Hsinchu (TW); Chih-Ping Chao, Hsinchu (TW); Hua-Chou Tseng, Hsinchu (TW); Chun-Hung Chen, Xinpu Township (TW); Chia-Yi Su, Yonghe (TW); Alex Kalnitsky, San Francisco, CA (US); Jye-Yen Cheng, Taichung (TW); Harry-Hak-Lay Chuang, Hsinchu (TW)

(73) Assignee: TAIWAN SEMICONDUCTOR MANUFACTURING COMPANY, LTD., Hsinchu (TW)

(\*) Notice: Subject to any disclaimer, the term of this patent is extended or adjusted under 35 U.S.C. 154(b) by 0 days.

(21) Appl. No.: 15/481,802

(22) Filed: Apr. 7, 2017

(65) Prior Publication Data
US 2017/0213780 A1 Jul. 27, 2017

Related U.S. Application Data

(62) Division of application No. 12/948,184, filed on Nov. 17, 2010, now Pat. No. 9,620,421.

(51) Int. Cl.
*H01L 21/8238* (2006.01)
*H01L 23/48* (2006.01)
*H01L 27/088* (2006.01)
*H01L 29/06* (2006.01)
(Continued)

(52) U.S. Cl.
CPC ...... *H01L 23/481* (2013.01); *H01L 21/76802* (2013.01); *H01L 21/76816* (2013.01); *H01L 21/76895* (2013.01); *H01L 21/823475* (2013.01); *H01L 27/088* (2013.01); *H01L 29/0653* (2013.01)

(58) Field of Classification Search
CPC .............. H01L 23/5329; H01L 23/5283; H01L 23/5226
See application file for complete search history.

(56) References Cited

U.S. PATENT DOCUMENTS 5,935,766 A * 8/1999 Cheek ............... H01L 21/76838
257/E21.582
5,949,092 A * 9/1999 Kadosh ............... H01L 27/0688
257/241

(Continued)

*Primary Examiner* — Yu-Hsi D Sun
(74) *Attorney, Agent, or Firm* — Hauptman Ham, LLP

(57) ABSTRACT

An integrated circuit includes a substrate, a first inter-layer dielectric (ILD) layer over the substrate, and a gate strip having a first width formed in the first ILD layer. A conductive strip having a second width is provided on the gate strip, with the second width being greater than the first width. The conductive strip is positioned so that the gate strip is covered and a portion of the conductive strip extends over a top surface of the first ILD adjacent the gate strip. A second ILD layer is provided over the conductive strip and the first ILD layer with a contact plug extending through the second ILD layer to provide electrical contact to the conductive strip.

20 Claims, 16 Drawing Sheets

(51) Int. Cl.
*H01L 21/8234* (2006.01)
*H01L 21/768* (2006.01)

(56) References Cited

U.S. PATENT DOCUMENTS

| | | | |
|---|---|---|---|
| 5,966,597 A * | 10/1999 | Wright | H01L 21/28061 |
| | | | 257/E21.2 |
| 6,300,201 B1 | 10/2001 | Shao et al. | |
| 6,737,310 B2 | 5/2004 | Tsai et al. | |
| 2007/0102821 A1* | 5/2007 | Papa Rao | H01L 21/7682 |
| | | | 257/758 |
| 2008/0191352 A1 | 8/2008 | Yu et al. | |

* cited by examiner

METAL GATE TRANSISTOR, INTEGRATED CIRCUITS, SYSTEMS, AND FABRICATION METHODS THEREOF

PRIORITY CLAIM

The present application is a divisional of U.S. application Ser. No. 12/948,184, filed Nov. 17, 2010, which is incorporated herein by reference in its entirety.

TECHNICAL FIELD

The present disclosure relates generally to the field of semiconductor devices, and more particularly, to metal gate transistors, integrated circuits, systems, and fabrication methods thereof.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

During the scaling trend, various materials have been implemented for the gate electrode and gate dielectric for CMOS devices. CMOS devices have typically been formed with a gate oxide and polysilicon gate electrode. There has been a desire to replace the gate oxide and polysilicon gate electrode with a high-k gate dielectric and metal gate electrode to improve device performance as feature sizes continue to decrease.

As the technology continues to be scaled down, e.g., for 28 nanometer (nm) technology nodes and below, metal gate electrodes with narrow widths may introduce an issue of high gate resistance. The issue of high gate resistance may affect the electrical performance of CMOS devices. For example, the high gate resistance may degrade the maximum oscillation frequency (fmax), noise, and stability of radio frequency CMOS (RFCMOS) devices performing at high frequencies.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION OF ILLUSTRATIVE EMBODIMENTS

Figure 1:
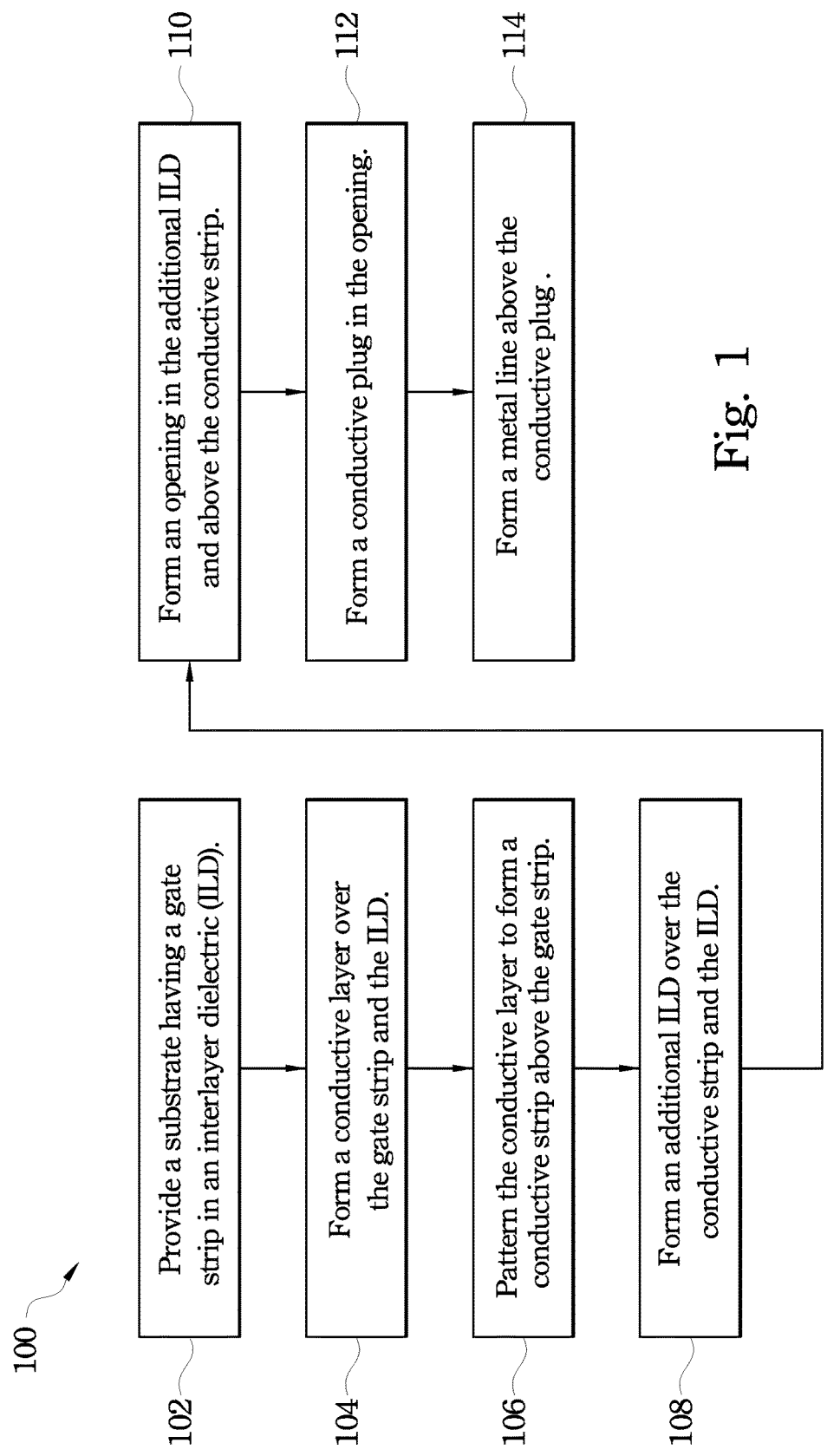
FIG. 1 is a flow chart of a method for fabricating an integrated circuit device according to an embodiment of the present disclosure.

It is understood that the following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 2-7A, various diagrammatic cross-sectional and perspective views of an embodiment of a semiconductor device 200 during various fabrication stages according to a method 100 of FIG. 1 are collectively described below. The semiconductor device 200 illustrates an integrated circuit, or portion thereof, that can comprise memory cells and/or logic circuits. The semiconductor device 200 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), radio frequency CMOS (RFCMOS), high voltage transistors, other suitable components, and/or combinations thereof. It is understood that additional steps can be provided before, during, and/or after the method 100, and some of the steps described below can be replaced or eliminated, for additional embodiments of the method. It is further understood that additional features can be added in the semiconductor device 200, and some of the features described below can be replaced or eliminated, for additional embodiments of the semiconductor device 200.

Figure 2:
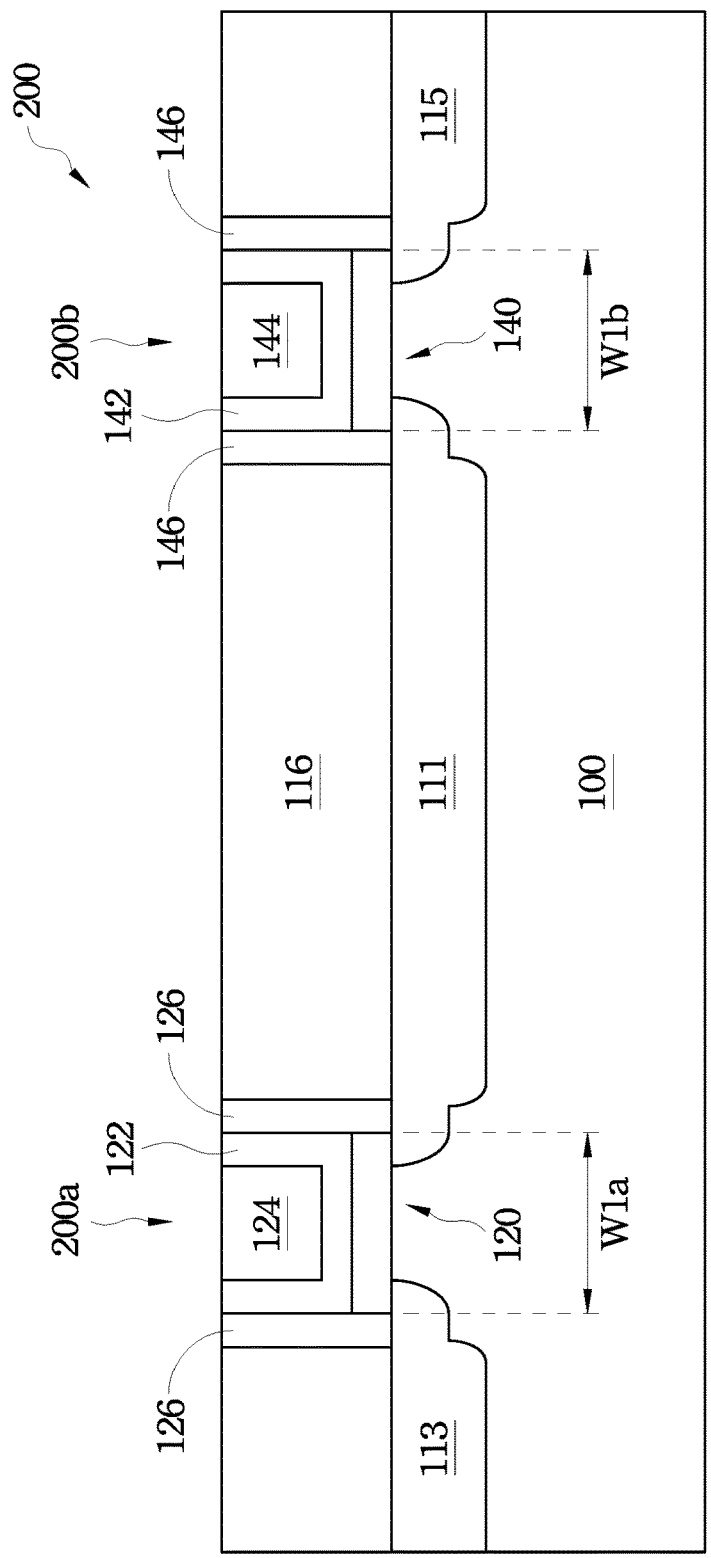
FIGS. 2-7A are various diagrammatic cross-sectional views and perspective views of an embodiment of an integrated circuit device during various fabrication stages according to the method of FIG. 1.

Referring to FIGS. 1 and 2, the method 100 begins at step 102, wherein a substrate 100 is provided. In the present embodiment, the substrate 100 is a semiconductor substrate comprising silicon. Alternatively, the substrate 100 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AnnAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 100 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 100, in a P-well structure, in an N-well structure, in a dual-well structure, or using a raised structure. The semiconductor device 200 may include a NFET device and/or a PFET device, and thus, the substrate 100 may include various doped regions configured for a particular device in each of the NFET device and/or the PFET device.

Referring again to FIG. 1, an interlayer dielectric (ILD) 116, often referred to as ILD0, can be disposed over the substrate 100. The ILD layer 116 may include a dielectric material, such as an oxide, a nitride, an oxynitride, a low-k dielectric material, an ultra low-k dielectric material, an extreme low-k dielectric material, another dielectric material, or combinations thereof. The ILD layer 116 may be formed by, for example, a chemical vapor deposition (CVD) process, a high-density plastic (HDP) CVD process, a high aspect ratio process (HARP), a spin-coating process, other deposition processes, and/or any combinations thereof. In other embodiments, additional dielectric layers (not shown) can be formed below or over the ILD 116.

In embodiments, a first gate strip 200a and a second gate strip 200b are formed in the ILD 116 and over the substrate 100. The first gate strip 200a may include, in order, a gate dielectric 120 and a gate electrode 122. The second gate strip 200b may include, in order, a gate dielectric 140 and a gate electrode 142. The first and second gate strips 200a, 200b may have a width W1a and W1b, respectively, formed by deposition.

In embodiments, the gate dielectrics 120 and 140 include a dielectric material, such as a silicon oxide, a silicon oxynitride, a silicon nitride, a high-k dielectric material, another suitable dielectric material, or combinations thereof. Exemplary high-k dielectric materials include $HfO_2$, HfSiO, HfSiON, HfTaO, HfTiO, HfZrO, other suitable materials, or combinations thereof. The gate dielectrics 120, 140 may be a multilayer structure, for example, including an interfacial layer, and a high-k dielectric material layer formed on the interfacial layer. An exemplary interfacial layer may be a grown silicon oxide layer formed by a thermal process or atomic layer deposition (ALD) process.

The gate electrodes 122, 142 formed over the gate dielectrics 120, 140, respectively, may each include a conductive layer having a proper work function. Therefore, the gate electrodes 122, 142 can also be referred to as a work function layer. The work function layer comprises any suitable material, such that the layer can be tuned to have a proper work function for enhanced performance of the associated device. For example, if a p-type work function metal (p-metal) for the PFET device is desired, TiN or TaN may be used. On the other hand, if an n-type work function metal (n-metal) for the NFET device is desired, Ta, TiAl, TiAlN, or TaCN, may be used. The work function layer may include doped conducting oxide materials.

In embodiments, gate spacers 126, 146 are formed in the ILD 116 and overlying opposite sidewalls of the first gate strip 200a and the second gate strip 200b, respectively, by a suitable process. The gate spacers 126, 146 may include a dielectric material such as an oxide, a nitride, an oxynitride, another dielectric material, or combinations thereof. In another embodiment, liners (not shown) may be formed between the gate strips 200a, 200b and the gate spacers 126, 146 by a suitable process. The liners may comprise a suitable dielectric material different from the gate spacers 126, 146.

In embodiments, an electrical transmission structure 124 and an electrical transmission structure 144 are formed in the ILD 116 and over the gate electrodes 122, 142, respectively. The electrical transmission structures 124, 144 may each include a conductive material, such as aluminum, copper, tungsten, metal alloys, metal silicides, other suitable materials, or combinations thereof. The electrical transmission structures 124, 144 may be formed by deposition and chemical mechanical polish (CMP).

In some embodiments, a common source or a common drain region 111 (referred to as a source/drain hereinafter) may be located in substrate 100 and between the first and second gate strips 200a and 200b. Source/drain regions 113 and 115 may be formed adjacent to the first and second gate strips 200a and 200b, respectively. The first gate strip 200a and source/drain regions 111 and 113 form a first MOS device, and the second gate strip 200b and source/drain regions 111 and 115 form a second MOS device.

Figure 3:
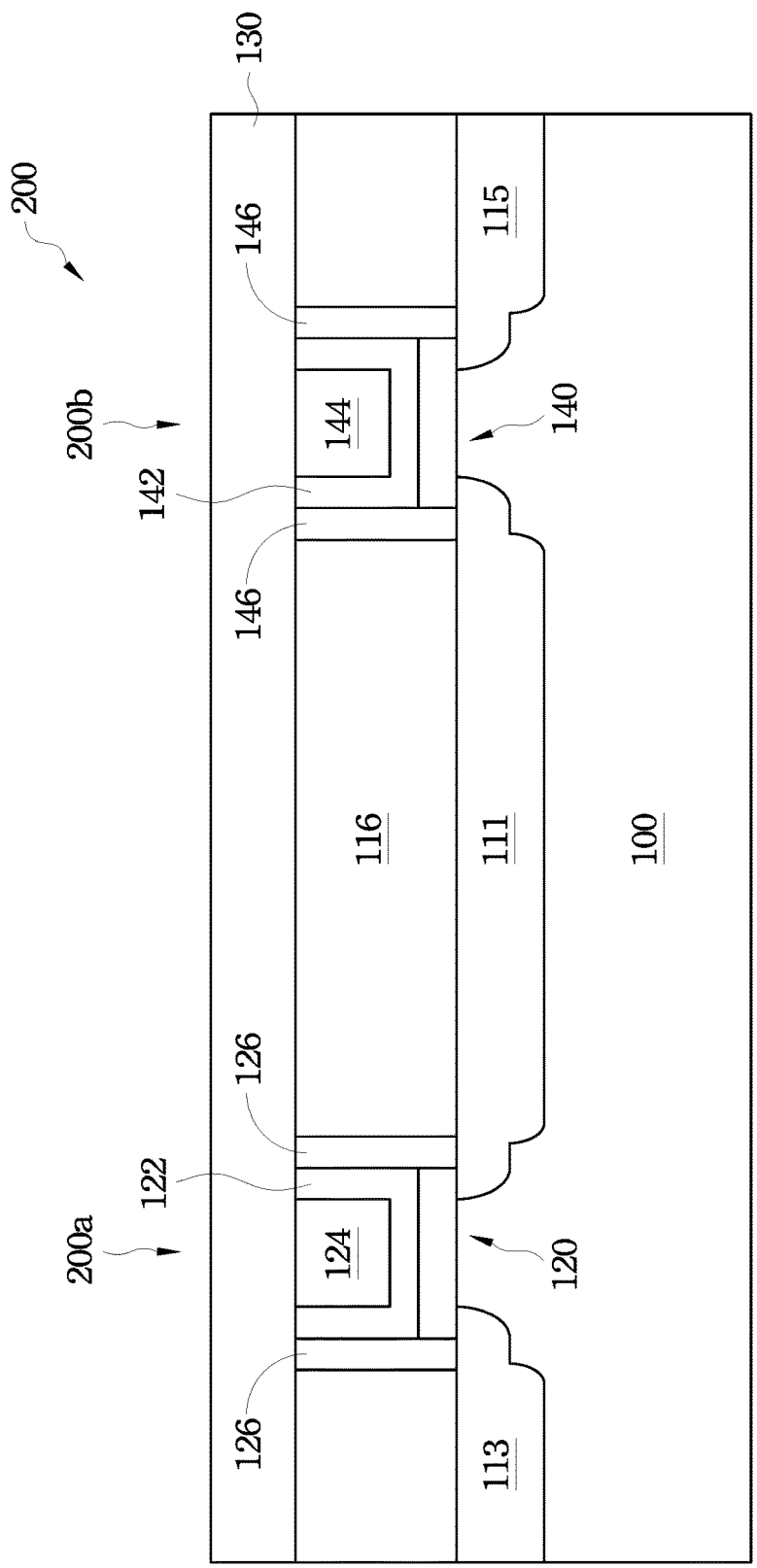

Referring to FIGS. 1 and 3, the method 100 continues with step 104 in which a conductive layer 130 is formed over the ILD layer 116, the first and second gate strips 200a, 200b, and the electrical transmission structures 124, 144. The conductive layer 130 may be a metal layer, such as aluminum, copper, tungsten; a metal alloy layer, such as TiN, TiW, TaN; other suitable materials; or combinations thereof. In some embodiments, the conductive layer 130 has a thickness ranging between about 100 Angstroms and about 10,000 Angstroms.

Figure 4:
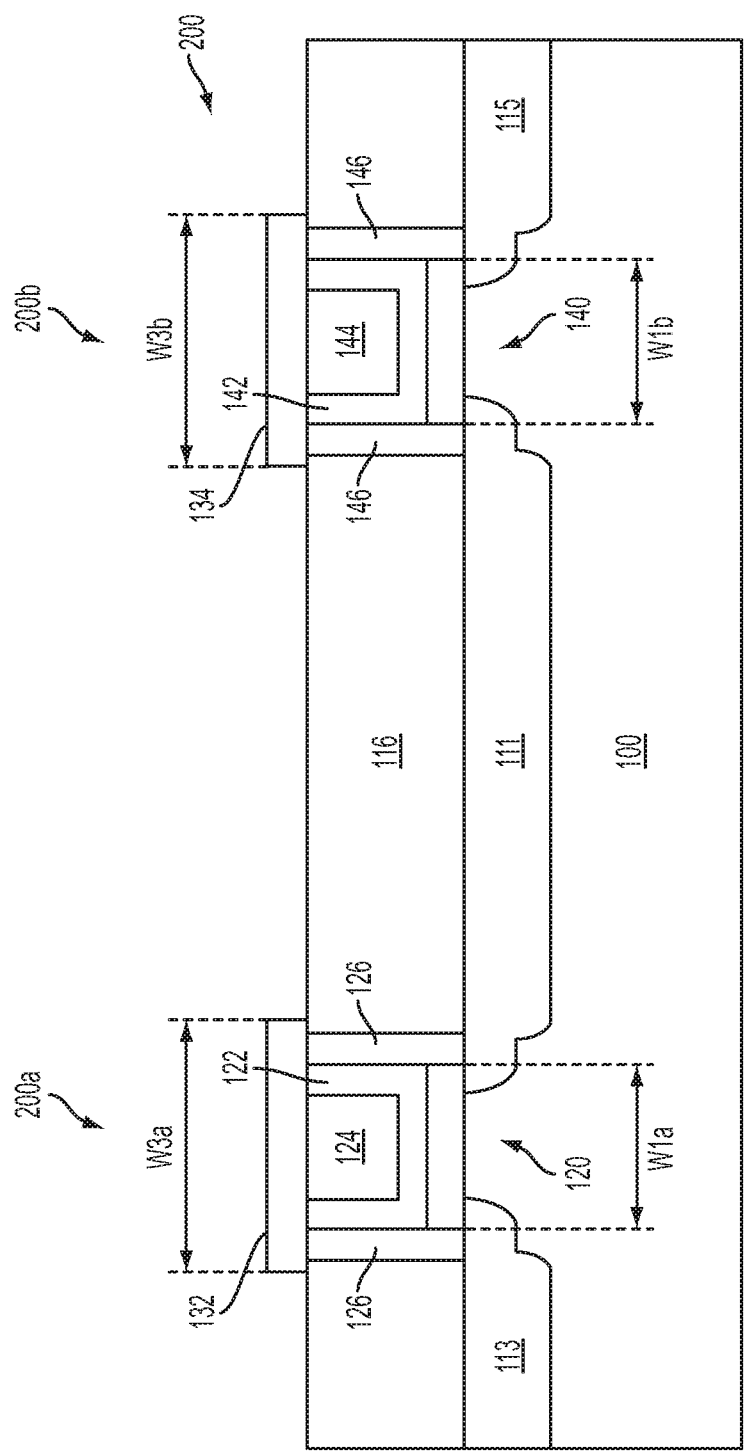

Referring to FIGS. 1 and 4, the method 100 continues with step 106 in which the conductive layer 130 is patterned by a patterning process to form conductive strips 132, 134. The conductive strip 132 is over the first gate strip 200a and the electrical transmission structure 124. The conductive strip 134 is over the second gate strip 200b and the electrical transmission structure 144. The patterning process, for example, includes forming a layer of photoresist (not shown) over the conductive layer 130 by a suitable process, such as spin-on coating, and then exposing and developing the layer of photoresist to form a photoresist feature. Then, the pattern of the photoresist feature can be transferred to the underlying conductive layer 130 to form the conductive strips 132, 134 by a dry etching process. In some embodiments, the conductive strips 132, 134 may have a width W3a, W3b, respectively. In one embodiment, the widths W3a, W3b, are greater than the widths W1a, W1b, respectively. In other embodiment, a ratio of the width W3a to the width W1a and/or a ratio of the width W3b to the width W1b range between about 1 and about 6.

Figure 4A:
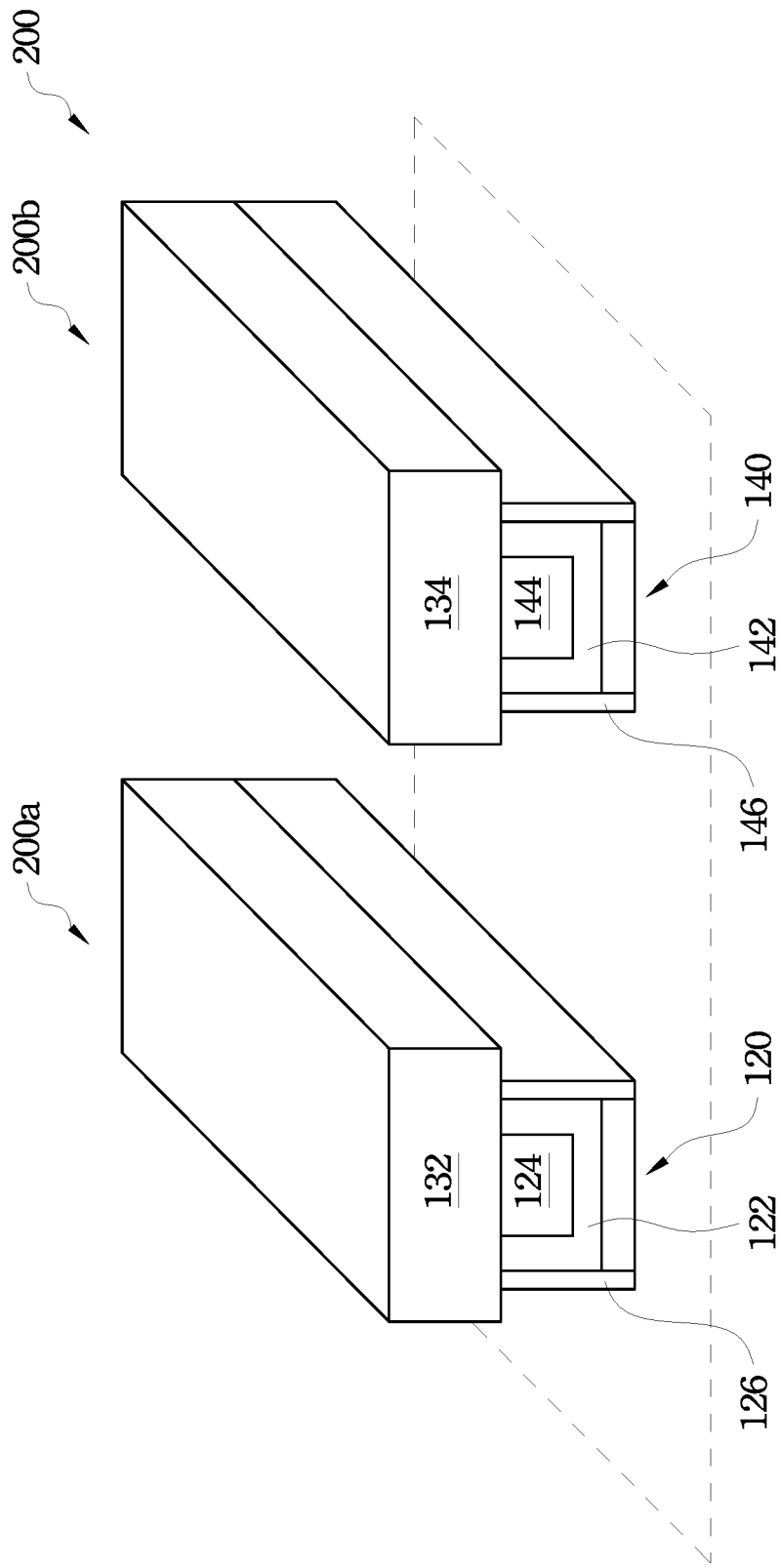

Alternatively, the step 104 for forming the conductive layer 130 may be omitted when the conductive layer 130 uses the material same as to the electrical transmission structures 124, 144. For example, the related process flow may include depositing an Al layer in and over the ILD116 and over the first and second gate strips 200a, 200b; removing a portion of the Al layer over the ILD116 to form a planarized surface; and patterning the planarized Al layer to form the electrical transmission structures 124, 144 and the conductive strips 132, 134. A perspective view of the structure shown in FIG. 4 is illustrated in FIG. 4A.

Figure 5:
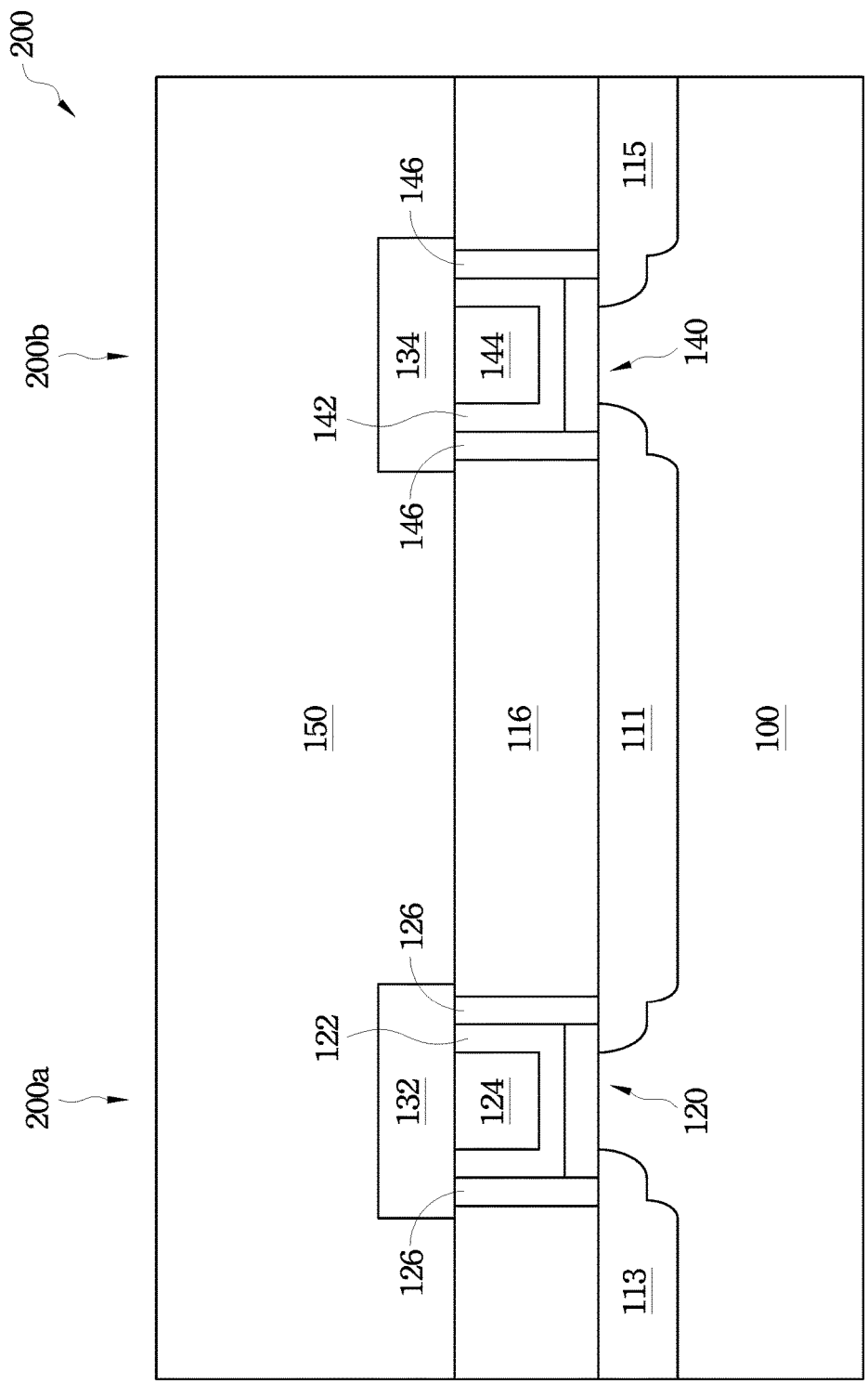

Referring to FIGS. 1 and 5, the method 100 continues with step 108 in which an additional ILD 150, often referred to as ILD1, is formed over the conductive strips 132, 134 and the ILD 116. The additional ILD layer 150 may include a dielectric material, such as an oxide, a nitride, an oxynitride, a low-k dielectric material, an ultra low-k dielectric material, an extreme low-k dielectric material, another dielectric material, or combinations thereof. The additional ILD layer 150 may be formed by, for example, a CVD process, a HDP CVD process, a HARP, a spin-coating process, another deposition process, and/or any combinations thereof. In embodiments, the additional ILD layer 150 may include a material that is the same as is used for ILD 116.

Figure 6:
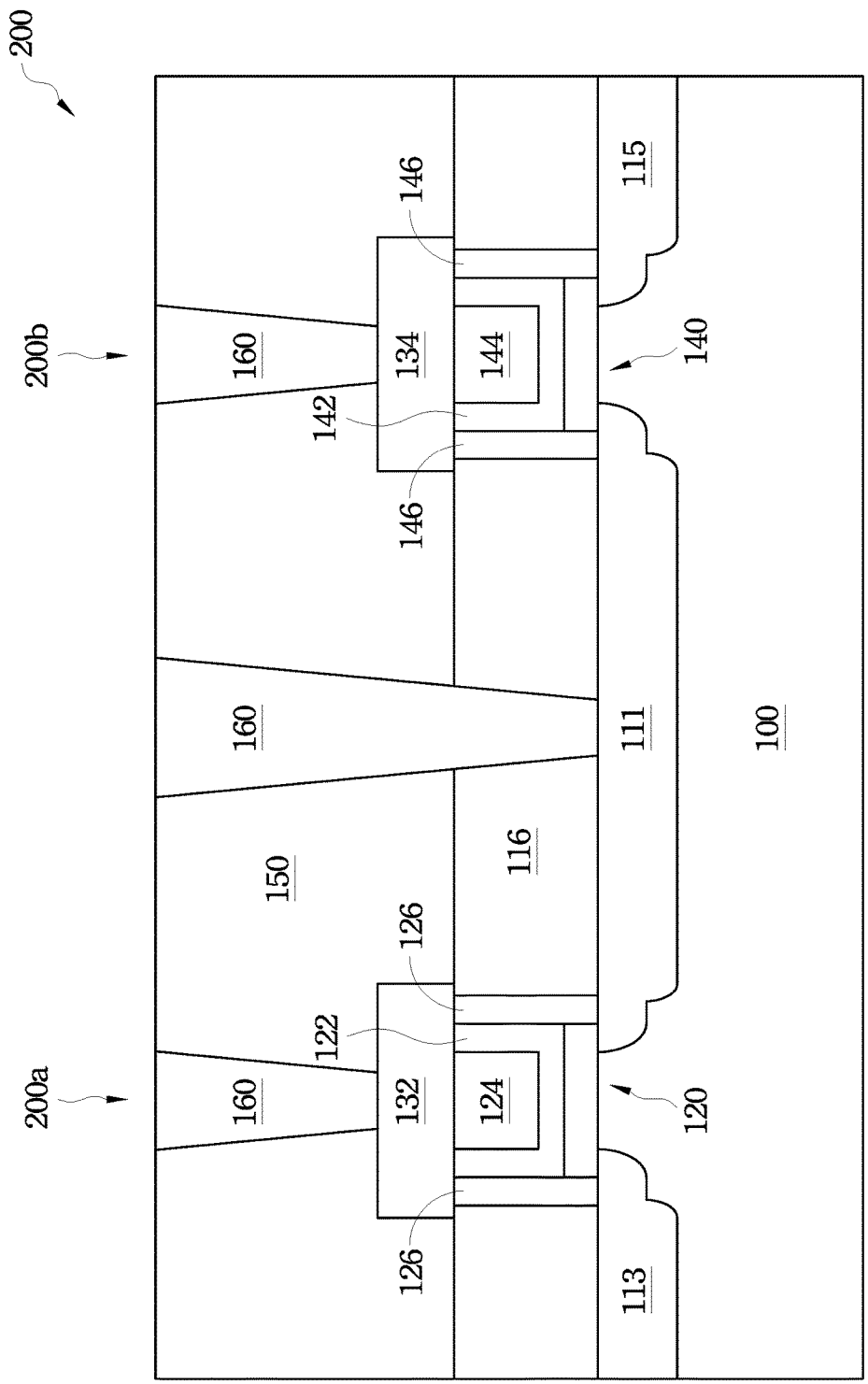

Referring to FIGS. 1 and 6, the method 100 continues with steps 110, 112 in which contact openings (not shown) are formed in the additional ILD 150 and/or the ILD 116 by a commonly used etching process. In embodiments, at least three contact openings are formed over the conductive strips 132, 134 and the common source/drain region 111. Subsequently, a conductive layer (not shown) may be filled in the contact openings and above the additional ILD 150. Then, a CMP process may be provided to completely remove the portion of conductive layer over the additional ILD 150 and form contact plugs 160 in the additional ILD 150 and/or the ILD 116.

Figure 7:
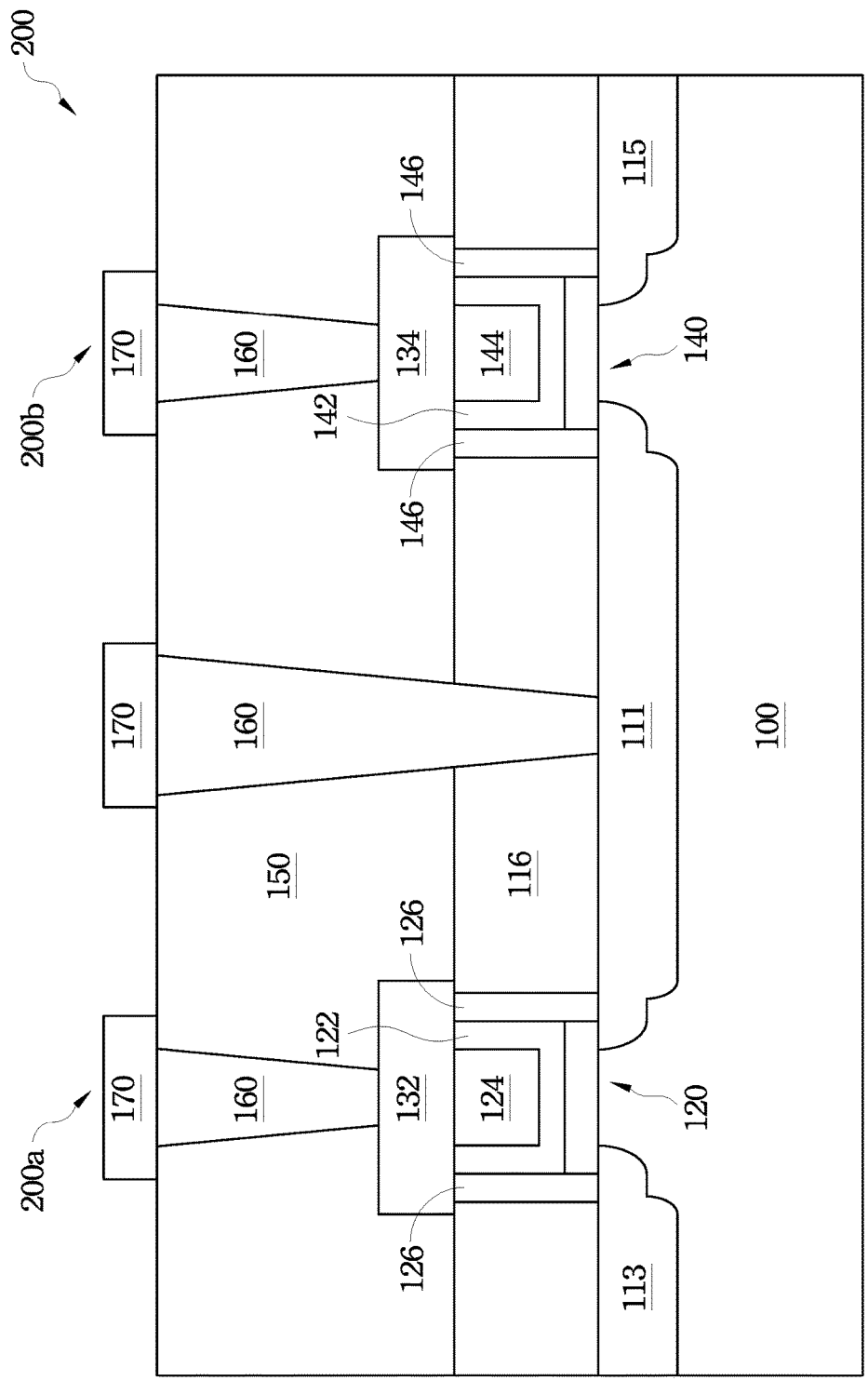
Figure 7A:
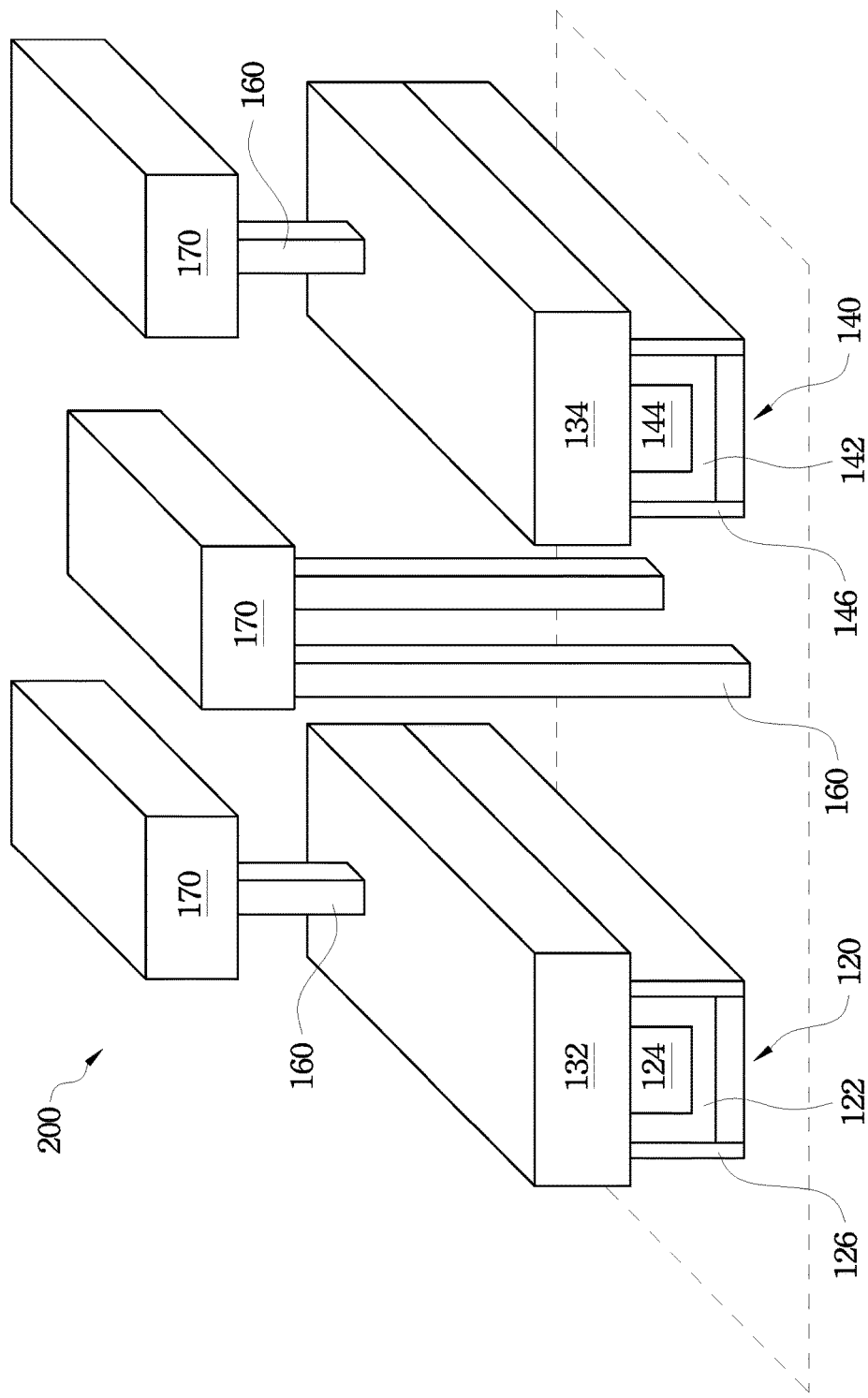

Referring to FIGS. 1 and 7, the method 100 continues with steps 114 in which metal lines 170, often referred to as M1, are formed over the contact plugs 160. A perspective view of the structure shown in FIG. 7 is illustrated in FIG. 7A.

Figure 8:
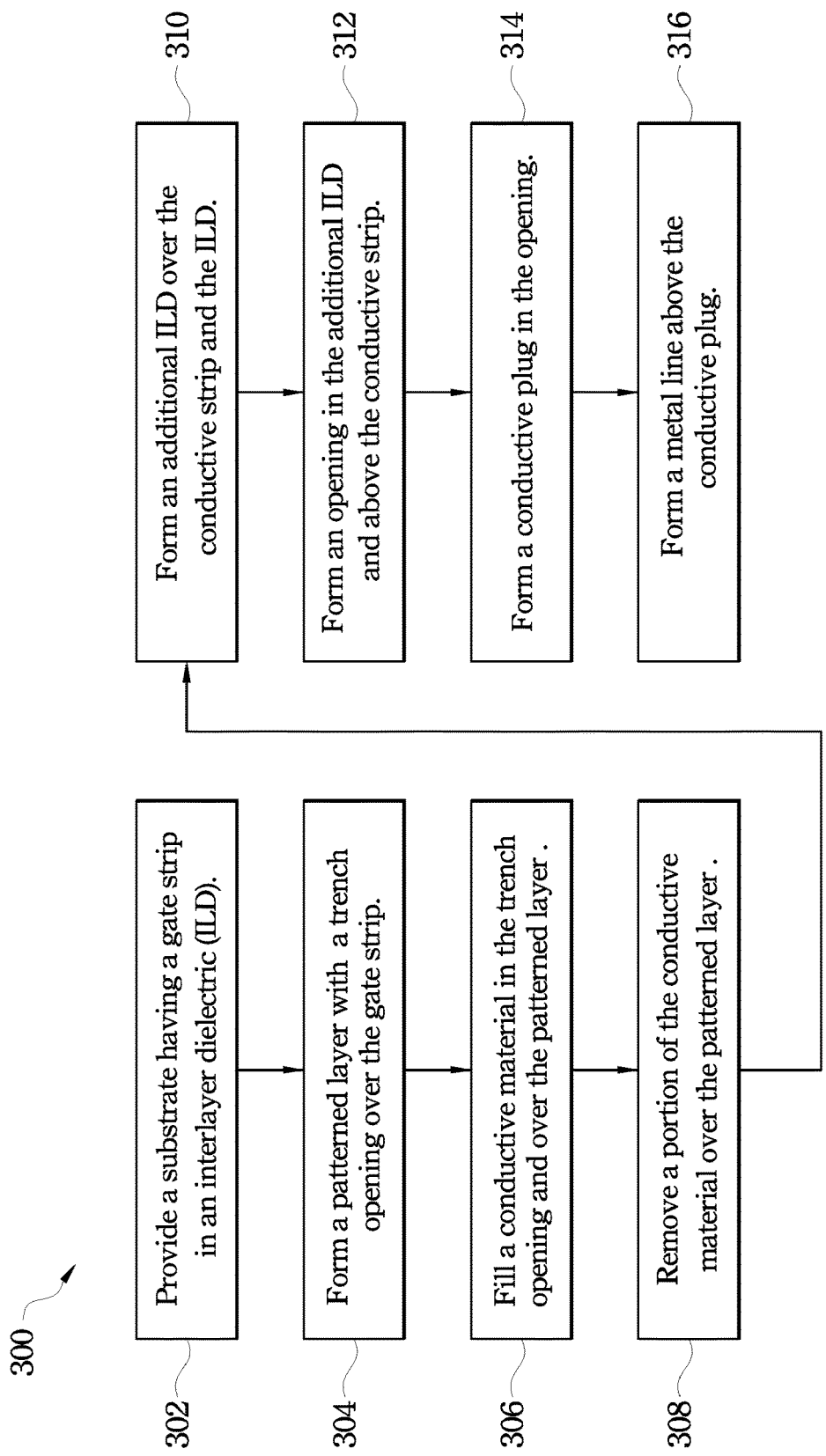
FIG. 8 is a flow chart of a method for fabricating an integrated circuit device according to another embodiment of the present disclosure.

With reference to FIGS. 9-14, various diagrammatic cross-sectional views of an embodiment of a semiconductor device 400 during various fabrication stages according to a method 300 of FIG. 8 are collectively described below. The semiconductor device 400 illustrates an integrated circuit, or portion thereof, that can comprise memory cells and/or logic circuits. The semiconductor device 400 can include passive components such as resistors, capacitors, inductors, and/or fuses; and active components, such as P-channel field effect transistors (PFETs), N-channel field effect transistors (NFETs), metal-oxide-semiconductor field effect transistors (MOSFETs), complementary metal-oxide-semiconductor transistors (CMOSs), radio frequency CMOS (RFCMOS), high voltage transistors, other suitable components, and/or combinations thereof. It is understood that additional steps can be provided before, during, and/or after the method 300, and some of the steps described below can be replaced or eliminated, for additional embodiments of the method. It is further understood that additional features can be added in the semiconductor device 400, and some of the features described below can be replaced or eliminated, for additional embodiments of the semiconductor device 400.

Figure 9:
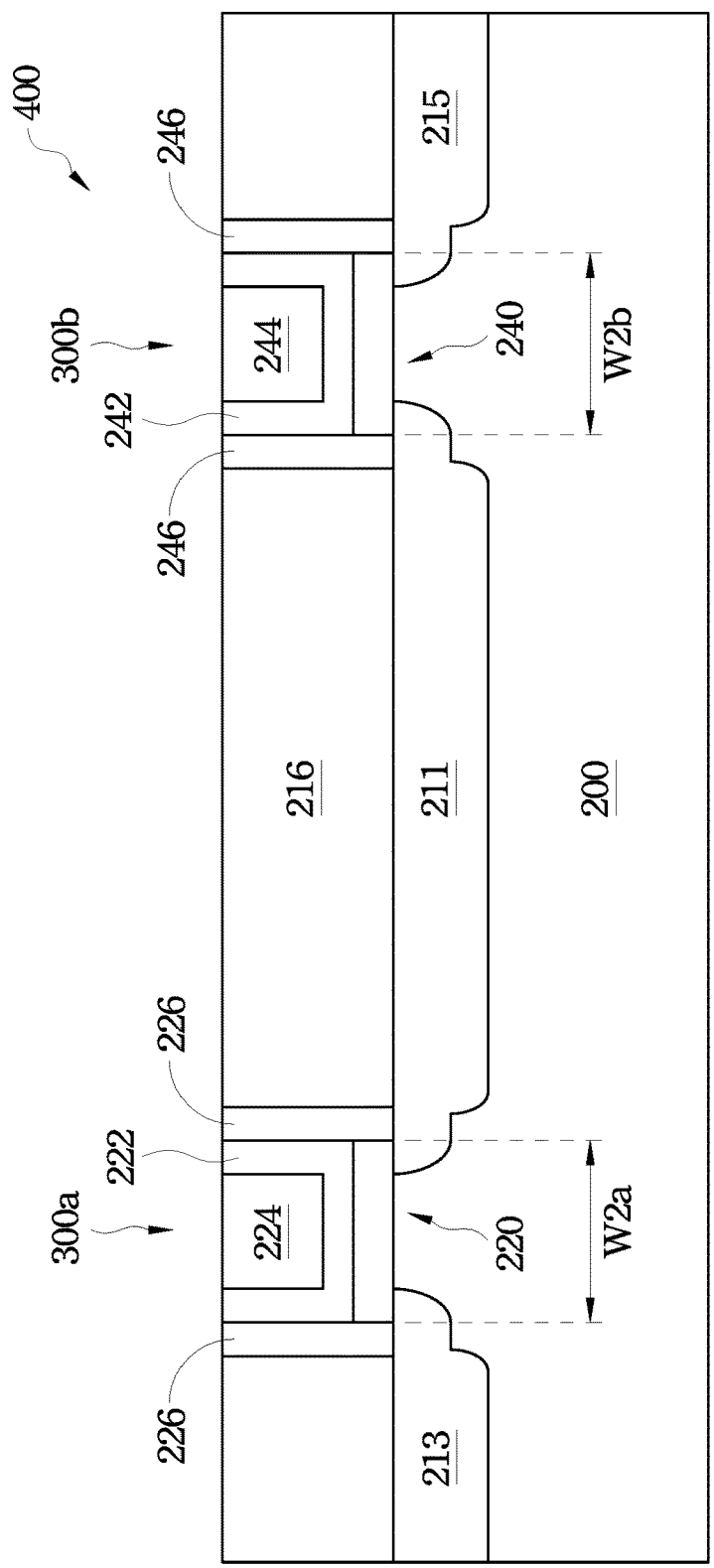
FIGS. 9-14 are various diagrammatic cross-sectional views of an embodiment of an integrated circuit device during various fabrication stages according to the method of FIG. 8.

Referring to FIGS. 8 and 9, the method 300 begins at step 302, wherein a structure of the semiconductor device 400 is provided with the same items in FIG. 1 indicated by the same reference numerals, increased by 100. In embodiments, an ILD layer 216 is positioned over a substrate 200. In embodiments, a first gate strip 300a including a gate electrode 222 over a gate dielectric 220 and a second gate strip 300b including a gate electrode 242 over a gate dielectric 240 are positioned in the ILD 216. The first and second gate strips 300a, 300b each has a width W2a, W2b, respectively. In embodiments, a common source/drain 211 is located in substrate 200 and between the first and second gate strips 300a and 300b. Source/drain regions 213 and 215 may be adjacent to the first and second gate strips 300a and 300b, respectively. In embodiments, gate spacers 226, 246 are positioned in the ILD 116 and overlying opposite sidewalls of the first and second gate strips 300a, 300b, respectively. In embodiments, electrical transmission structures 224, 244 are positioned in the ILD 116 and over the gate electrodes 222, 242, respectively.

Figure 10:
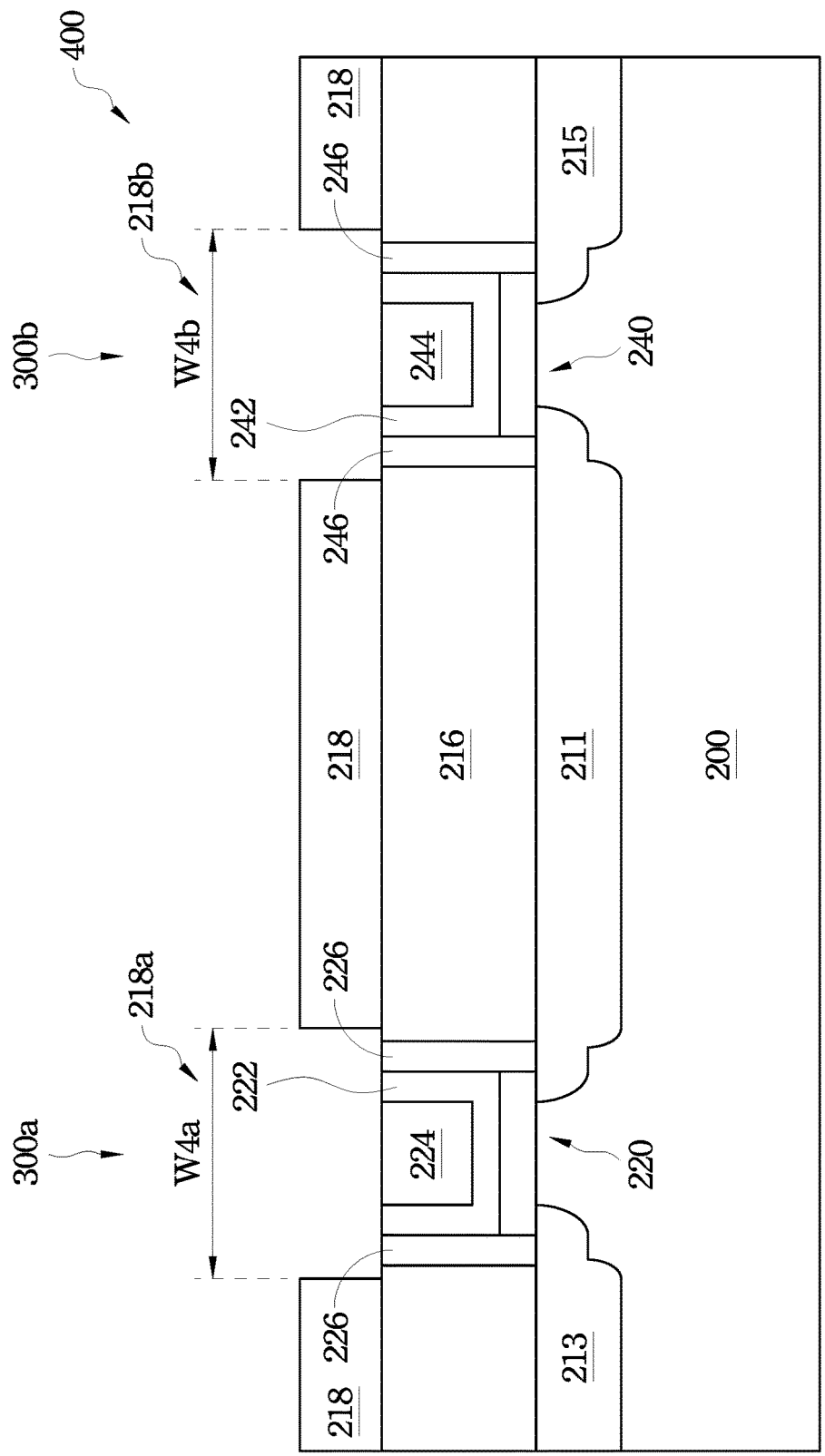

Referring to FIGS. 8 and 10, the method 300 continues with steps 304 in which a patterned layer 218 is formed over the ILD 216. In one embodiment, the patterned layer 218 is a dielectric layer. In another embodiment, the patterned layer 218 includes a material which is the same as is used for the ILD 216. In embodiments, the patterned layer 218 has a trench opening 218a above the first gate strip 300a and a trench opening 218b above the second gate strip 300b. The trench openings 218a, 218b have widths W4a, W4b, respectively. In embodiments, the patterned layer 218 has a thickness ranging between about 100 Angstroms and about 10,000 Angstroms.

Figure 11:
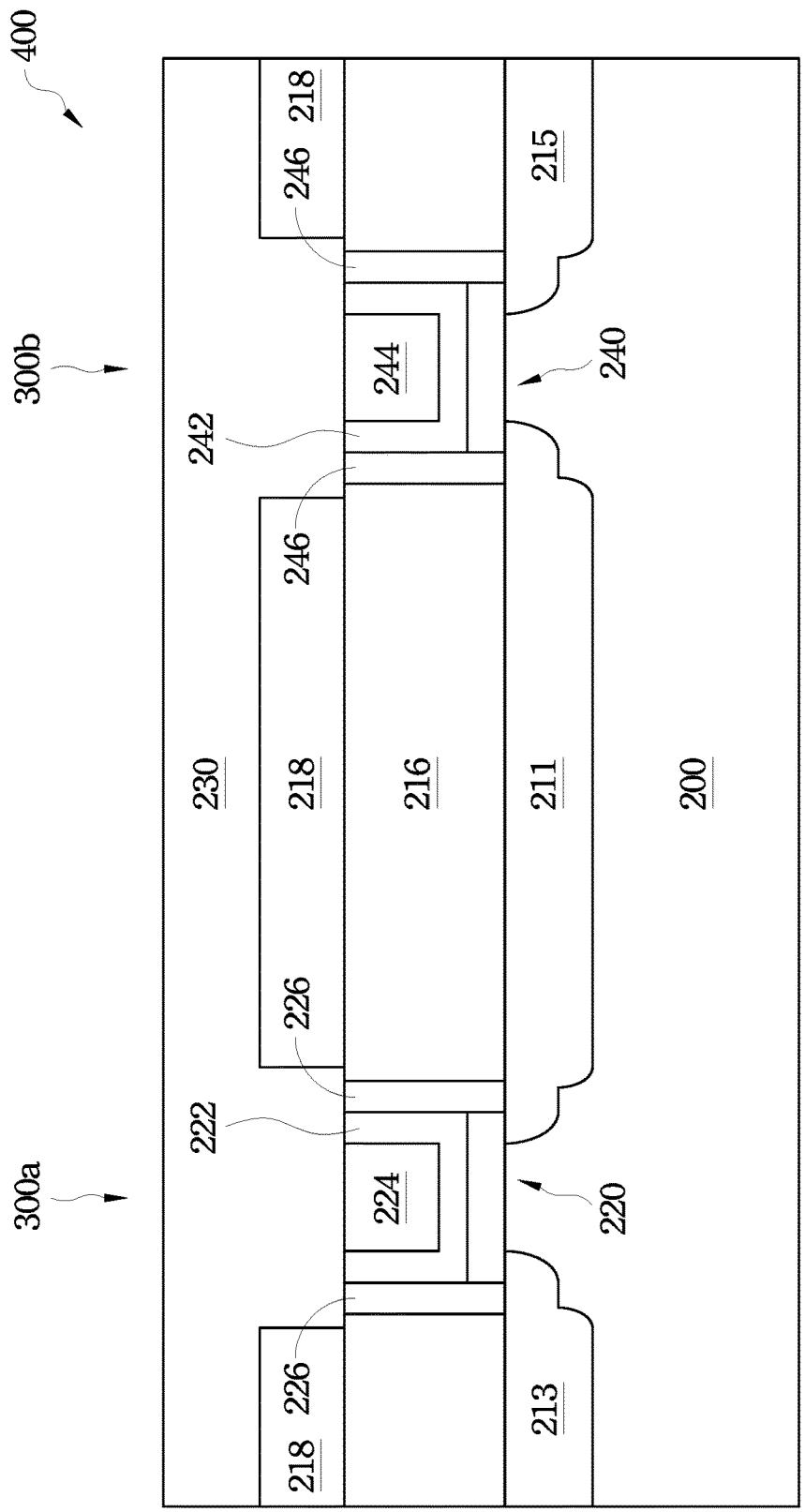

Referring to FIGS. 8 and 11, the method 300 continues with steps 306 in which a conductive layer 230 is formed in the trench openings 218a, 218b and over the patterned layer 218. The conductive layer 230 may be a metal layer, such as aluminum, copper, tungsten; a metal alloy layer, such as TiN, TiW, TaN; other suitable materials; or combinations thereof.

Figure 12:
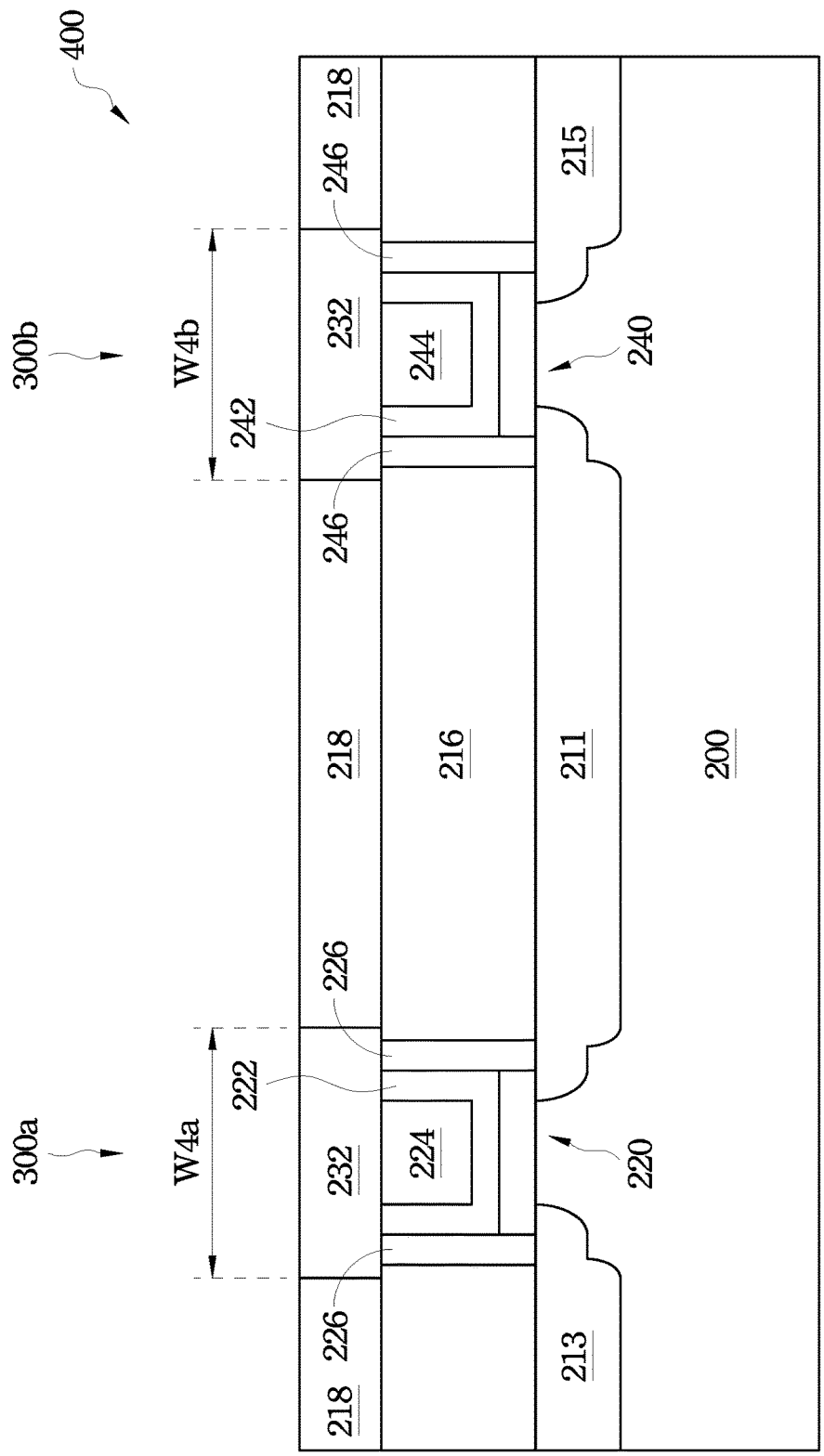

Referring to FIGS. 8 and 12, the method 300 continues with steps 308 in which portions of the conductive layer 230 over the patterned layer 218 are removed to form conductive strips 232, 234. The conductive strip 232 over the electrical transmission structure 224 and the first gate strip 300a has the width W4a. The conductive strip 234 over the electrical transmission structure 244 and the second gate strip 300b has the width W4b. In embodiments, the removing process includes a CMP process, therefore, the conductive strips 232, 234 have planarized surfaces substantially co-planar with the surface of the patterned layer 218.

Figure 13:
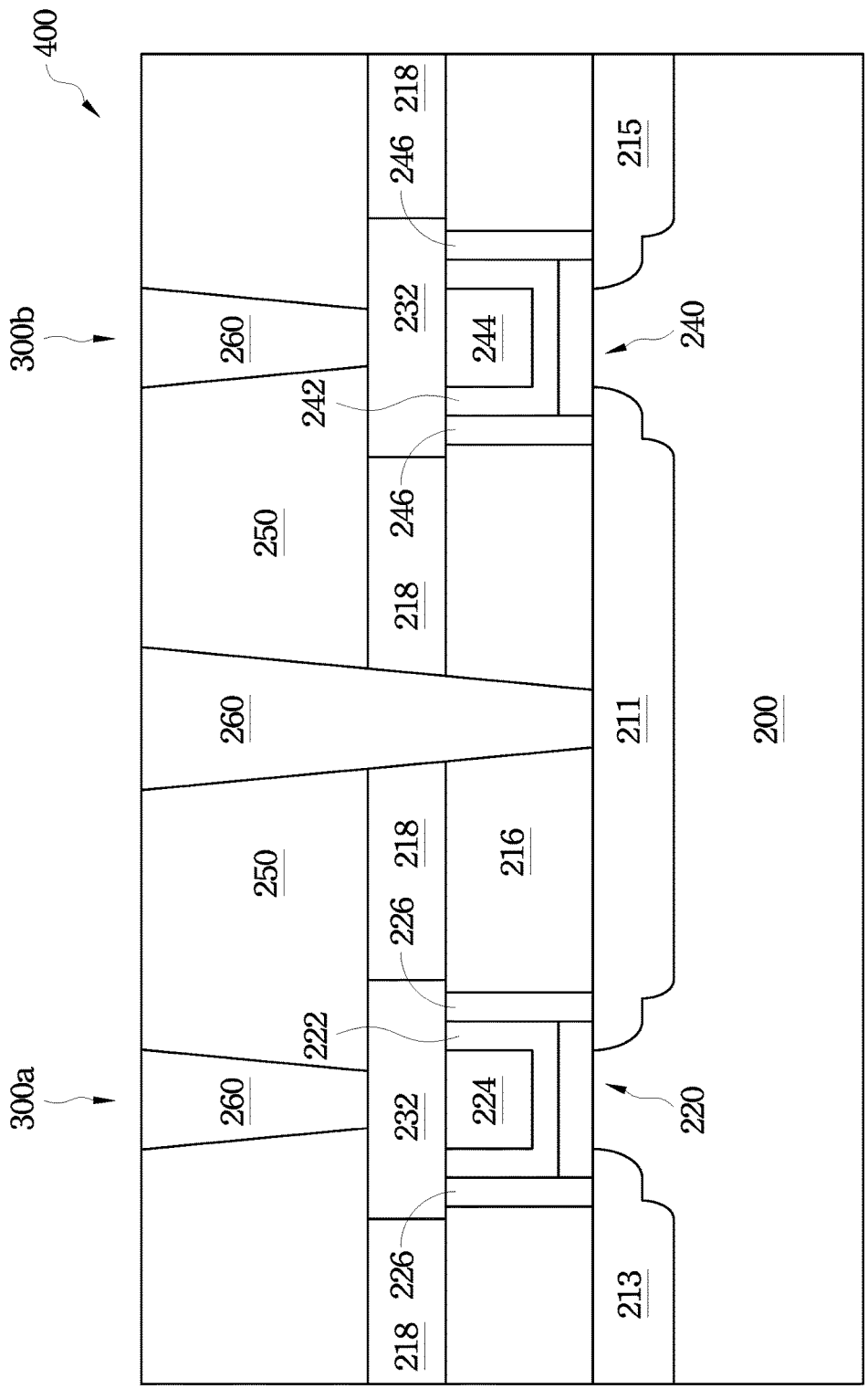

Referring to FIGS. 8 and 13, the method 300 continues with steps 310-314 in which an additional ILD 250 is formed over the conductive strips 232, 234 and the patterned layer 218. The additional ILD layer 250 may include a dielectric material, such as an oxide, a nitride, an oxynitride, a low-k dielectric material, an ultra low-k dielectric material, an extreme low-k dielectric material, another dielectric material, or combinations thereof. In embodiments, the additional ILD layer 250 may include a material which is the same as is used for the ILD 216. Subsequently, contact openings (not shown) are formed in the additional ILD 250, the patterned layer 218, and/or the ILD 216 by an etching process. In embodiments, at least three contact openings are formed over the conductive strips 232, 234 and the common source/drain 211. Thereafter, a conductive layer (not shown) may be filled in the contact openings and above the additional ILD 250, and then, a CMP process may be provided to completely remove the portion of conductive layer over the additional ILD 250 and form contact plugs 260 in the additional ILD 250, the patterned layer 218, and/or the ILD 216.

Figure 14:
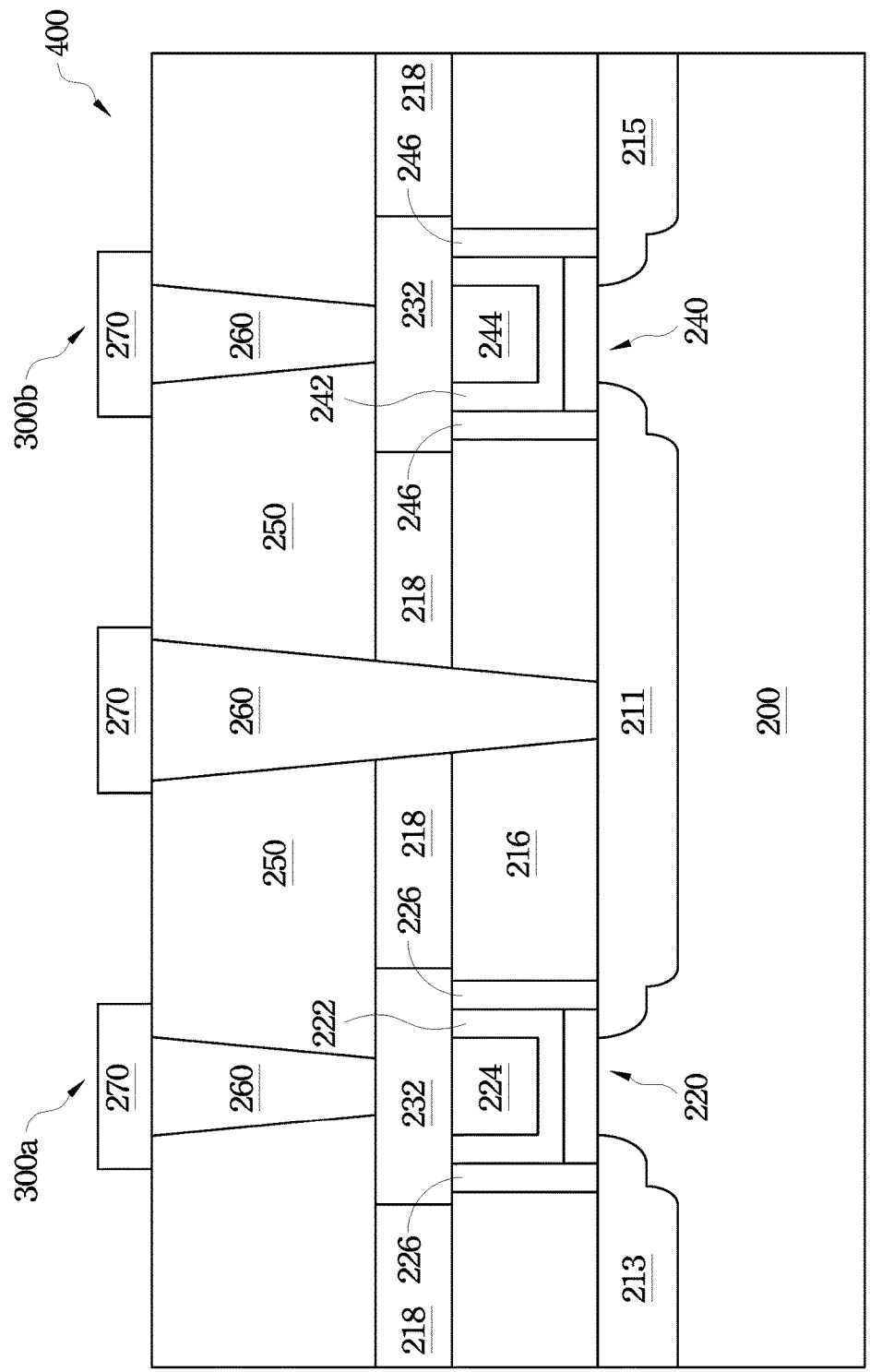

Referring to FIGS. 8 and 14, the method 300 continues with steps 316 in which metal lines 270 are formed over the contact plugs 260. A perspective view of the structure shown in FIG. 14 is the same as illustrated in FIG. 7A.

The embodiments of the present invention have several advantageous features. By forming the conductive strip with sufficient thickness and parallel with the gate strip, the overall gate resistance is reduced. Therefore, the electrical performance of CMOS devices is improved. This is particularly beneficial for RFCMOS devices formed by the gate-last approach due to high gate resistance may cause degradation on electrical maximum oscillation frequency (fmax), noise, and stability when the devices performing at high frequencies.

One aspect of this description relates to a first embodiment of an integrated circuit. The integrated circuit includes a substrate, a first inter-layer dielectric (ILD) layer over the substrate, and a gate strip formed in the first ILD layer. The gate strip comprises spacers and has a first width measured in a first direction parallel to a top surface of the first ILD. The integrated circuit further includes a conductive strip having a second width measured in the first direction in direct contact with the gate strip, wherein the second width is greater than the first width, and wherein a portion of the conductive strip extends over a top surface of the first ILD, a second ILD layer over the conductive strip and the first ILD layer; and at least one contact plug extending through the second ILD layer and directly contacting the conductive strip.

Another aspect of this description relates to another embodiment of an integrated circuit. The integrated circuit structure includes a first inter-layer dielectric (ILD) layer over a substrate and first and second gate strips formed in the first ILD layer. The first and second gate strip comprises spacers with the first gate strip having a first width and the second gate strip having a second width, both the first and second widths being measured in a first direction parallel to a top surface of the first ILD. The integrated circuit further includes conductive strips formed over the first and second gate strips, a conductive strip having a third width being formed directly on the first gate strip and a second conductive strip having a fourth width being formed directly on the second gate strip, both the third and fourth widths being measured in the first direction and with both the first and second conductive strips being wider than the first and second gate strips on which they are formed. The integrated circuit further includes a second ILD layer over the first and second conductive strips and the first ILD layer and first and second contact plugs extending through the second ILD layer and directly contacting the first and second conductive strips.

Another aspect of this description relates to another embodiment of an integrated circuit. The integrated circuit structure includes a first inter-layer dielectric (ILD) layer over a substrate, a gate strip formed in the first ILD layer, the gate strip comprising a gate dielectric, a gate electrode defining a channel, an electrical transmission structure formed in the channel defined by the gate electrode; and spacers formed on outer surfaces of the gate electrode with the gate strip having a first width measured in a first direction parallel to a top surface of the first ILD. The integrated circuit structure also includes a second ILD layer over the first ILD layer and a conductive strip in the second ILD layer with the conductive strip having a second width measured in the first direction. The conductive strip is in direct contact with both an upper surface of the gate electrode and an upper surface of the electrical transmission structure and extends over a surface of the second ILD layer adjacent the gate strip. The gate strip and the conductive strip are sized so that the second width is greater than the first width. The integrated circuit structure also includes a third ILD layer over the conductive strip and the second ILD layer with at least one contact plug extending through the third ILD layer and directly contacting the conductive strip.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An integrated circuit structure comprising:
a first inter-layer dielectric (ILD) layer over a substrate;
a gate strip in the first ILD layer, wherein the gate strip comprises spacers and the gate strip has a first width measured in a first direction parallel to a top surface of the first ILD;
a conductive strip having a second width measured in the first direction in direct contact with the gate strip, wherein the second width is greater than the first width, and wherein a portion of the conductive strip extends over a top surface of the first ILD;
a second ILD layer over the conductive strip and the first ILD layer; and
a contact plug extending through the second ILD layer and directly contacting the conductive strip.

2. The integrated circuit structure of claim 1, further comprising:
a third ILD surrounding the conductive strip and between the first and second ILD layers.

3. The integrated circuit structure of claim 1, wherein:
the gate strip further comprises an electrical transmission structure.

4. The integrated circuit structure of claim 1, wherein:
the conductive strip comprises W, Al, Cu, TiN, TaN, TiW, or combinations thereof.

5. The integrated circuit structure of claim 1, wherein:
a ratio of the second width to the first width ranges from about 1 to about 6.

6. The integrated circuit structure of claim 1, wherein:
the conductive strip has a thickness ranging from about 100 Å to about 10,000 Å.

7. The integrated circuit structure of claim 1, wherein:
the gate strip further comprises:
a gate dielectric;
a gate electrode formed on the gate dielectric; and
an electrical transmission structure, the electrical transmission structure being partially surrounded by the gate electrode.

8. The integrated circuit structure of claim 7, wherein:
the gate dielectric comprises $HfO_2$, HfSiO, HfSiON, HfTaO, HfTiO, HfZrO, or combinations thereof.

9. The integrated circuit structure of claim 7, wherein:
the gate electrode comprises a p-type work function metal or an n-type work function metal.

10. The integrated circuit structure of claim 7, wherein:
the electrical transmission structure comprises aluminum, copper, tungsten, metal alloys, metal silicides, or combinations thereof.

11. An integrated circuit structure comprising:
a first inter-layer dielectric (ILD) layer over a substrate;
a first gate strip in the first ILD layer, wherein the first gate strip comprises spacers and the first gate strip has a first width measured in a first direction parallel to a top surface of the first ILD;
a second gate strip in the first ILD layer, wherein the second gate strip comprises spacers and the second gate strip has a second width measured in the first direction;
a common source/drain region in the substrate, the common source/drain region extending between the first gate strip and the second gate strip;
a first conductive strip having a third width measured in the first direction in direct contact with the first gate strip, wherein the third width is greater than the first width, and wherein a bottom-most surface of the first conductive strip extends over a top surface of the first ILD;
a second conductive strip having a fourth width measured in the first direction in direct contact with the second gate strip, wherein the fourth width is greater than the second width, and wherein a bottom-most surface of the second conductive strip extends over the top surface of the first ILD;
a second ILD layer over the first and second conductive strips and the first ILD layer;
a first contact plug extending through the second ILD layer and directly contacting the first conductive strip; and
a second contact plug extending through the second ILD layer and directly contacting the second conductive strip.

12. The integrated circuit structure according to claim 11, wherein:
the common source/drain region extends under a first portion of the first gate strip and a under a first portion of the second gate strip.

13. The integrated circuit structure according to claim 12, further comprising:
a third contact plug extending through the second ILD layer and the first ILD layer and directly contacting the common source/drain region.

14. The integrated circuit structure according to claim 13, further comprising:
a first metal pattern layer on the second ILD layer.

15. The integrated circuit structure according to claim 14, wherein:
the first metal pattern layer provides an electrical connection to the first contact plug, the second contact plug, and the third contact plug.

16. The integrated circuit structure of claim 11, wherein:
a first ratio of the third width to the first width ranges between about 1 to about 6; and
a second ratio of the fourth width to the second width ranges between about 1 to about 6.

17. The integrated circuit structure of claim 15, wherein:
a third ratio of the first ratio to the second ratio is about 1.

18. The integrated circuit structure of claim 15, wherein:
a fourth ratio of the first width to the second width is about 1.

19. The integrated circuit structure according to claim 11, wherein:
the first gate strip further comprises a first gate dielectric and the common source/drain region extends below a spacer and a first portion of the first gate dielectric; and
the second gate strip further comprises a second gate dielectric and the common source/drain region extends below a spacer and a first portion of the second t gate dielectric.

20. An integrated circuit structure comprising:
a first inter-layer dielectric (ILD) layer over a substrate;
a gate strip in the first ILD layer, wherein the gate strip comprises
a gate dielectric;
a gate electrode formed on the gate dielectric, the gate electrode defining a channel;
an electrical transmission structure, the electrical transmission structure being formed in the channel defined by the gate electrode; and
spacers adjacent outer surfaces of the gate electrode, the gate strip having a first width measured in a first direction parallel to a top surface of the first ILD;
a patterned layer over the first ILD layer; and
a conductive strip in the patterned layer, the conductive strip having a second width measured in the first direction, the conductive strip being in direct contact with both
an upper surface of the gate electrode, and
an upper surface of the electrical transmission structure,
wherein the second width is greater than the first width, and wherein a bottom-most surface of the conductive strip extends over a surface region of the first ILD;
a second ILD layer over the conductive strip and the patterned layer; and
a contact plug extending through the second ILD layer and directly contacting the conductive strip.

* * * * *